(12) United States Patent
Mikalo

(10) Patent No.: US 9,508,618 B2
(45) Date of Patent: Nov. 29, 2016

(54) STAGGERED ELECTRICAL FRAME STRUCTURES FOR FRAME AREA REDUCTION

(71) Applicant: GLOBAL FOUNDRIES US INC., Grand Cayman Country (KY)

(72) Inventor: Ricardo Mikalo, Heideblick (DE)

(73) Assignee: GLOBALFOUNDRIES INC., Grand Cayman (KY)

( * ) Notice: Subject to any disclaimer, the term of this patent is extended or adjusted under 35 U.S.C. 154(b) by 175 days.

(21) Appl. No.: 14/251,402

(22) Filed: Apr. 11, 2014

(65) Prior Publication Data

US 2015/0294918 A1    Oct. 15, 2015

(51) Int. Cl.
*G01R 31/20* (2006.01)
*H01L 21/66* (2006.01)
*G01R 31/28* (2006.01)

(52) U.S. Cl.
CPC ........... *H01L 22/34* (2013.01); *G01R 31/2831* (2013.01); *G01R 31/2867* (2013.01)

(58) Field of Classification Search
CPC .......... G01R 1/07342; G01R 1/06772; G01R 31/2886
USPC .......................... 324/754.07, 754.03, 754.08
See application file for complete search history.

(56) References Cited

U.S. PATENT DOCUMENTS

| | | | | |
|---|---|---|---|---|
| 5,059,899 A | * | 10/1991 | Farnworth | G01R 31/2884 257/48 |
| 5,153,507 A | * | 10/1992 | Fong | G01R 1/04 257/786 |
| 5,214,657 A | * | 5/1993 | Farnworth | G06F 11/1008 257/202 |
| 5,416,429 A | * | 5/1995 | McQuade | G01R 1/07342 324/72.5 |
| 5,506,510 A | * | 4/1996 | Blumenau | G01R 1/07385 324/149 |
| 5,818,249 A | * | 10/1998 | Momohara | G01R 1/07342 324/756.03 |
| 5,838,627 A | * | 11/1998 | Tomishima | G11C 5/025 365/201 |
| 5,898,700 A | * | 4/1999 | Kim | G01R 31/31712 324/762.05 |
| 6,163,036 A | * | 12/2000 | Taninaka | H01L 25/0753 257/88 |
| 6,211,537 B1 | * | 4/2001 | Shimizu | B41J 2/45 257/100 |
| 6,229,329 B1 | * | 5/2001 | Nakata | G01R 31/2886 324/754.07 |
| 6,365,443 B1 | * | 4/2002 | Hagiwara | H01L 22/32 257/E21.662 |
| 6,485,994 B1 | * | 11/2002 | Ohno | B41J 2/45 438/22 |
| 6,529,031 B2 | * | 3/2003 | Gerstmeier | G11C 29/006 324/762.09 |

(Continued)

*Primary Examiner* — Tung X Nguyen
*Assistant Examiner* — Dominic Hawkins
(74) *Attorney, Agent, or Firm* — DITTHAVONG & STEINER, P.C.

(57) ABSTRACT

A method of forming a group of probe pads or sets of probe pads and DUTs in a staggered pattern within a portion of a pad row and the resulting device are disclosed. Embodiments include forming a first group of probe pads or sets of probe pads and DUTs in a pad row on a wafer; and forming a second group of probe pads and DUTs in the pad row on the wafer, wherein the probe pads or sets of probe pads of the first group are staggered along the pad row, and each DUT of the first group is aligned with a probe pad perpendicular to the pad row.

18 Claims, 3 Drawing Sheets

(56) References Cited

U.S. PATENT DOCUMENTS

| | | | |
|---|---|---|---|
| 6,534,853 B2 * | 3/2003 | Liu | G01R 31/2884 257/690 |
| 6,784,685 B2 * | 8/2004 | Chao | G01R 31/2884 324/754.05 |
| 6,844,631 B2 * | 1/2005 | Yong | H01L 22/32 257/48 |
| 6,972,576 B1 * | 12/2005 | Lyons | G03F 1/14 324/699 |
| 7,026,646 B2 * | 4/2006 | Cowles | G01R 31/2884 257/203 |
| 7,064,450 B1 * | 6/2006 | Eghan | H01L 22/32 257/48 |
| 7,247,879 B2 * | 7/2007 | Nishimura | G01R 31/2884 257/50 |
| 7,808,117 B2 * | 10/2010 | Vo | H01L 24/06 257/602 |
| 7,932,744 B1 * | 4/2011 | Greene | H03K 19/17744 326/101 |
| 8,115,321 B2 * | 2/2012 | Ali | H01L 22/32 257/773 |
| 8,436,635 B2 * | 5/2013 | Mollat | G01R 31/2884 324/762.01 |
| 8,581,250 B2 * | 11/2013 | Chen | H01L 22/32 257/48 |
| 8,723,546 B2 * | 5/2014 | Kister | G01R 1/07314 324/754.03 |
| 8,860,452 B2 * | 10/2014 | Lee | G01R 31/31908 324/756.03 |
| 8,932,884 B2 * | 1/2015 | Anderson | H01L 22/34 257/48 |
| 2002/0072136 A1 * | 6/2002 | Kanamaru | G01R 1/06733 438/17 |
| 2003/0107391 A1 * | 6/2003 | Bard | G01R 31/2884 324/762.01 |
| 2003/0107394 A1 * | 6/2003 | Khandros | G01R 31/2874 324/750.05 |
| 2005/0247882 A1 * | 11/2005 | Wear | G01T 1/366 250/370.12 |
| 2006/0139047 A1 * | 6/2006 | Zhou | G01R 31/2884 324/750.3 |
| 2007/0075718 A1 * | 4/2007 | Hess | H01L 22/34 324/762.05 |
| 2008/0029876 A1 * | 2/2008 | Niu | H01L 23/49816 257/693 |
| 2009/0166829 A1 * | 7/2009 | Nishiyama | G11C 5/063 257/676 |
| 2010/0308855 A1 * | 12/2010 | Pagani | B62M 25/04 324/756.03 |
| 2010/0327893 A1 * | 12/2010 | Vilas Boas | G01R 31/2884 324/754.07 |
| 2011/0101545 A1 * | 5/2011 | Yeo | H01L 22/32 257/786 |
| 2012/0006584 A1 * | 1/2012 | Matsui | G02F 1/1345 174/257 |
| 2012/0104387 A1 * | 5/2012 | Chen | H01L 22/34 257/48 |
| 2014/0332811 A1 * | 11/2014 | Kumar | H01L 22/32 257/48 |

* cited by examiner

STAGGERED ELECTRICAL FRAME STRUCTURES FOR FRAME AREA REDUCTION

TECHNICAL FIELD

The present disclosure relates to a testing methodology for semiconductor devices. The present disclosure is particularly applicable to electrical frame structures, or scribe line monitors (SLMs).

BACKGROUND

Current SLMs are used to monitor wafer production and enable wafer disposition. Thus, such SLMs are mandatory, but the goal is to minimize the area demand of these structures to allow the highest number of good chips per wafer during production. However, with the increasing complexity of modern products, more test structures are required, yet mechanical/physical limitations prevent any significant reduction in the size of the structures. Generally, needle cards cannot be manufactured with pitches significantly smaller than 72 micrometers ($\mu m$), for example, and the pad size cannot be reduced significantly below 35 $\mu m \times 35$ $\mu m$, for example.

The current industry standard for forming SLMs involves forming a single pad row with devices under test (DUTs) between probe pads, as illustrated in FIG. 1. In particular, a probe pad 101 and a DUT 103 are formed within a single probe pitch 105 of the pad row 107. Moreover, every pad row is touched sequentially to obtain the corresponding electrical results. Therefore, the maximum number of parametric test DUTs 103 is determined by the number of probe pads 101 in a single product scribe line, e.g., pad row 107. Also, the time required for testing is determined by the number of touchdowns.

A need therefore exists for a methodology enabling a reduction in the area demand for product monitoring structures without reducing the total number of DUTs and without introducing complicated new needle card probing processes, and the resulting device.

SUMMARY

An aspect of the present disclosure is method of forming a group of probe pads or sets of probe pads and DUTs in a staggered pattern within a portion of a pad row.

Another aspect of the present disclosure is a semiconductor device including a group of staggered probe pads or sets of probe pads and corresponding DUTs within a portion of a pad row.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a first group of probe pads or set of probe pads and DUTs in a pad row on a wafer; and forming a second group of probe pads and DUTs in the pad row on the wafer, wherein the probe pads or sets of probe pads of the first group are staggered along the pad row, and each DUT of the first group is aligned with a probe pad perpendicular to the pad row.

Aspects of the present disclosure include forming two probe pads or sets or probe pads and two DUTs or sets of DUTs of the first group within a probe pitch. Other aspects include forming a first DUT or set of DUTs of the first group on a first side of a first probe pad or set of probe pads of the first group and a second DUT or set of DUTs of the first group on an opposite of a second probe pad or set of probe pads of the first group, wherein consecutive DUTs or sets of DUTs of the first group are formed on alternating sides of corresponding probe pads or sets of probe pads. Further aspects include executing a first series of touch downs for each of the first probe pads or sets of probe pads and executing a second series of touch downs for each of the second probe pads or sets of probe pads. Additional aspects include forming a single probe pad or set of probe pads and a single DUT or set of DUTs of the second group within the probe pitch, wherein a size and/or electrical requirement of each of the DUTs of the second group prevents two probe pads or sets of probe pads from being formed within the probe pitch. Other aspects include forming the second group of probe pads and DUTs in a linear pattern. Further aspects include forming the linear pattern with a DUT between each pair of the probe pads or sets of probe pads.

Another aspect of the present disclosure is a device including: a first group of probe pads or sets of probe pads and DUTs in a pad row on a wafer; and a second group of probe pads and DUTs in the pad row on the wafer, wherein the probe pads or sets of probe pads of the first group are staggered along the pad row, and each DUT of the first group is aligned with a probe pad perpendicular to the pad row. Other aspects include two probe pads or sets of probe pads and two DUTs or sets of DUTs of the first group being formed within a probe pitch. Further aspects include a first DUT or set of DUTs of the first group being formed on a first side of a first probe pad or set of probe pads of the first group and a second DUT or set of DUTs of the first group being formed on a second probe pad or set of probe pads of the first group. Another aspect includes consecutive DUTs or sets of DUTs of the first group being formed on alternating sides of corresponding probe pads or set of probe pads. Another aspect includes a single probe pad or set of probe pads and a single DUT of the second group being formed within the probe pitch. Other aspects include the second group of probe pads and DUTs being formed in a linear pattern with a DUT between each of the probe pads or sets of probe pads.

A further aspect of the present disclosure is a method including: forming first, second, third, and fourth lines of probe pads parallel to each other on a wafer, wherein the probe pads of the second and fourth lines are staggered with respect to the probe pads of the first and third lines, respectively; and forming DUTs between the second and third lines. Other aspects include a first probe pad of the first line, a first probe pad of the second line, a DUT, a first probe pad of the third line, and a first probe pad of the fourth being formed within a probe pitch. Further aspects include connecting first and second probe pads of the first line and first and second probe pads of the third line to a first DUT; and connecting first and second probe pads of the second line and first and second probe pads of the fourth line to a second DUT. Additional aspects include forming two additional lines of probe pads, separate from the first, second, third, and fourth lines of probe pads, and a row of DUTs between the two additional lines of probe pads, with one DUT between each set of two probe pads of a first of the two additional lines and two probe pads of a second of the two additional lines. Another aspect includes one probe pad from the first additional line, one probe pad from the second additional line, and a DUT being formed within a probe pitch, and wherein a size and/or an electrical requirement of the each of the DUTs between the first and second additional two lines prevents an additional DUT or a line of probe pads from being formed within the probe pitch.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of a large scribe line area demand of product monitoring structures attendant upon monitoring wafer production and disposition. By forming a group of probe pads or sets of probe pads and DUTs in a staggered pattern within a portion of a pad row, the scribe line area demand of these product monitoring structures may be reduced without reducing the total number of DUTs and without introducing complicated new needle card probing processes.

Methodology in accordance with embodiments of the present disclosure includes forming a first group of probe pads or sets of probe pads and DUTs in a pad row on a wafer. A second group of probe pads and DUTs are formed in the pad row on the wafer, with the probe pads or sets of probe pads of the first group being staggered along the pad row, and each DUT of the first group being aligned with a probe pad in a direction perpendicular to the pad row.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
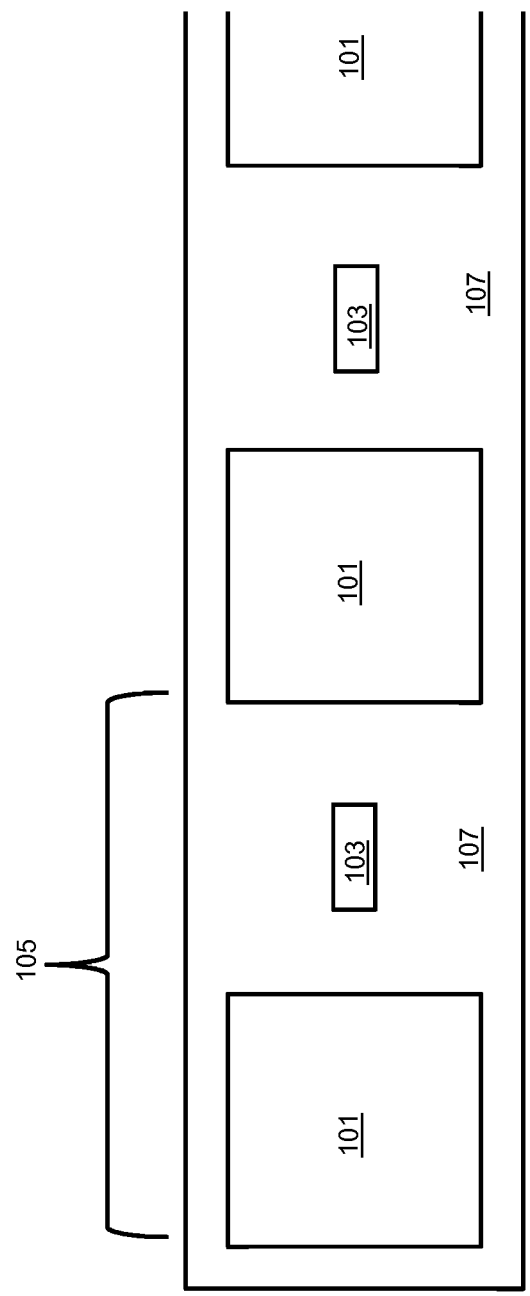
FIG. 1 schematically illustrates a background method of forming a single DUT and a single probe pad in a linear pattern within a single probe pitch of a pad row.
Figure 2:
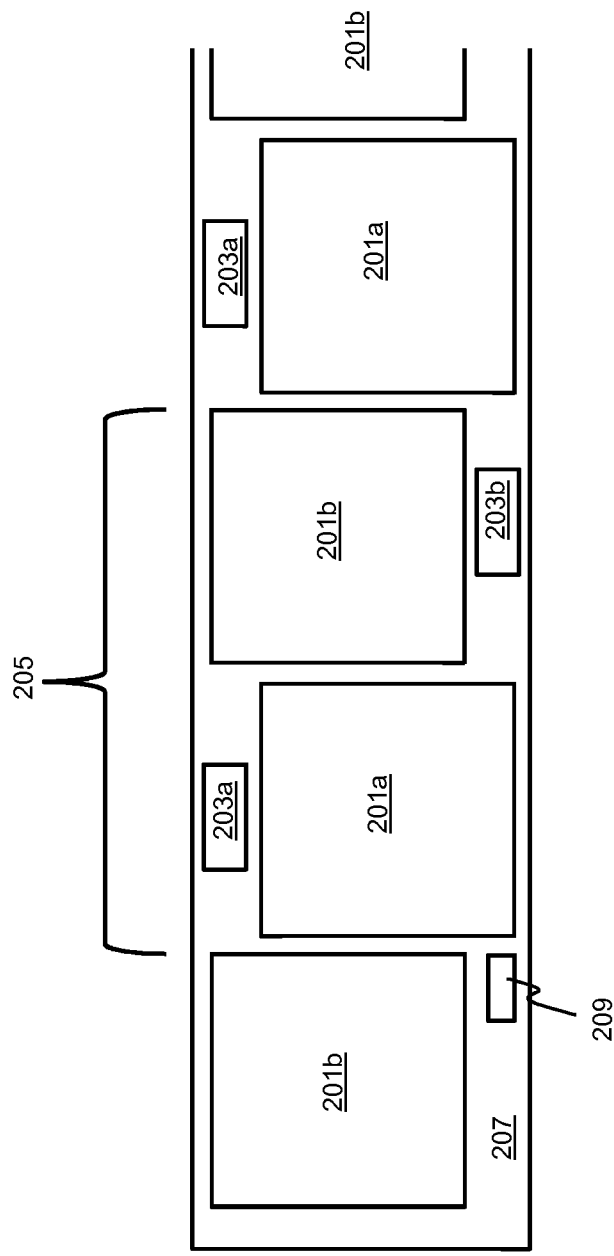
FIG. 2 schematically illustrates a method of forming a pair of probe pads and DUTs in a staggered pattern within a single probe pitch of a pad row, in accordance with an exemplary embodiment.

FIG. 2 schematically illustrates a method of forming a pair of probe pads and DUTs in a staggered pattern within a single probe pitch of a pad row, in accordance with an exemplary embodiment. Since many monitoring and wafer disposition DUTs are relatively small, the area between the pads can be double used without increasing probe card complexity or alignment procedures, and without increasing the width of the standard pad set outer boundary dimensions. Adverting to FIG. 2, two probe pads 201a and 201b and two DUTs 203a and 203b of a first group of probe pads (e.g., about 20 out of a typical frame monitoring set of 50) are formed in a staggered pattern within a probe pitch 205, for example, of a pad row 207, which also contains at least one optional optical recognition mark 209 to better enable proper alignment. Alternatively, if each of the elements 101 in FIG. 1 were instead a pair of (or three or more) probe pads, each of the elements 201a and 201b of FIG. 2 would also be a pair of (or three or more) probe pads. More specifically, a first DUT 203a of the first group is formed on a first side of a first probe pad 201a, e.g., above probe pad 201a, and a second DUT 203b of the first group is formed on an opposite of the second probe pad 201b of the first group, e.g., below probe pad 201b. Consequently, probe pads 201 of the first group are formed in a staggered pattern within a probe pitch, e.g., the probe pitch 205, of a pad row. Thereafter, a first series of touch downs are made for each of the first probe pads 201b, and then a second series of touch downs are made for each of the remaining probe pads 201a of the first group.

In contrast, a second group of probe pads and second group of DUTs (not shown for illustrative convenience) are formed in another portion of the pad row 207 according to the background art, as depicted in FIG. 1. In particular, only a single probe pad and a single DUT of the second group are formed within a probe pitch of the pad row 207, for example, because the size and/or electrical requirement of each of the DUTs of the second group prevents two of the probe pads of the second group from being formed within a single probe pitch of the pad row 207.

Figure 3:
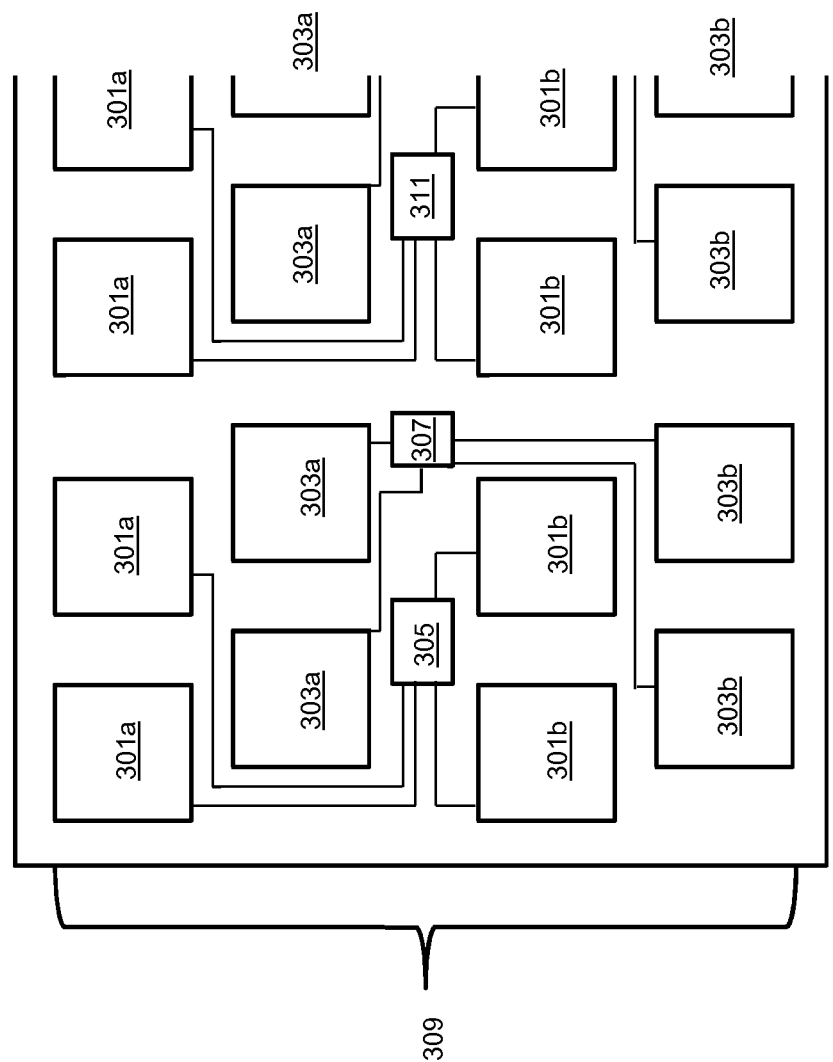
FIG. 3 schematically illustrates a method of forming multiple staggered lines of probe pads parallel to each on a wafer, in accordance with an exemplary embodiment.

Another current DUT arrangement includes two parallel lines of probe pads, with a row of DUTs centered therebetween (with one DUT in the middle of four probe pads, two from each line). For example, the current DUT arrangement would include only a line of probe pads 301a and a line of probe pads 301b from FIG. 3, with a row of DUTs 305 vertically centered between the line of probe pads 301a and the line of probe pads 301b. FIG. 3 schematically illustrates two additional lines of probe pads, staggered with respect to the aforementioned lines, in accordance with an exemplary embodiment. Adverting to FIG. 3, a first pair of lines of probe pads 301a and 303a are staggered with respect to each other, and a second pair of lines of probe pads 301b and 303b are likewise staggered with respect to each other, and DUTs 305 and 307 are formed therebetween. In particular, corresponding probe pads 301a, 303a, 301b, and 303b of the four lines and the DUT 305 or 307 are formed within a probe pitch 309, for example. In addition, the probe pads 301a and 301b are connected to DUT 305 and the probe pads 303a and 303b are connected to DUT 307.

In contrast, a pair of lines of probe pads and DUTs (not shown for illustrative purposes) are formed in another portion of the pad row, according to current industry standards, as described above. In particular, only a single DUT is formed in the middle of each set of two probe pads of one line of probe pads and two probe pads of a second line of probe pads, and the two lines are formed within a probe pitch, for example, because the size and/or the electrical requirement of each of the DUTs of the second group prevents additional DUTs or lines of probe pads from being formed within the probe pitch.

The embodiments of the present disclosure can achieve several technical effects including reducing the scribe line area demand of product monitoring structures, e.g., in the range of 20%, without reducing the total number of DUTs and without introducing complicated new needle card probing processes. In addition, other structures, particularly especially small test structures, may benefit from the embodiments of the present disclosure, e.g., Single-Kelvin-Contacts, Sheet-Resistance structures, Via-Kelvin-Contacts, Poly-Resistors, Well-Resistors, Diffusion-Resistors, 2-Probe-Resistors, 4-Probe-Resistors, Van der Pauw-Resistors, Junction-Diodes, Well-Diodes, single eFuses, back-end-of-line (BEOL) reliability test structures, etc. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, flat panel displays, and digital cameras. The present disclosure enjoys industrial applicability in various types of semiconductor devices including SLMs.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a first group of probe pads or sets of probe pads and devices under test (DUTs) in a pad row on a wafer; and
   forming a second group of probe pads and DUTs in the pad row on the wafer,
   wherein the probe pads or sets of probe pads of the first group are staggered along the pad row, and each DUT of the first group is aligned with a probe pad perpendicular to the pad row, each DUT of the first group corresponding to a single probe pad of the first group, and each probe pad of the first group corresponding to a single DUT of the first group.

2. The method according to claim 1, comprising forming two probe pads or sets of probe pads and two DUTs or sets of DUTs of the first group within a probe pitch.

3. The method according to claim 2, comprising forming a first DUT or set of DUTs of the first group on a first side of a first probe pad or set of probe pads of the first group and a second DUT or set of DUTs of the first group on an opposite side of a second probe pad or set of probe pads of the first group.

4. The method according to claim 3, wherein consecutive DUTs or sets of DUTs of the first group are formed on alternating sides of corresponding probe pads or sets of probe pads.

5. The method according to claim 2, comprising:
   executing a first series of touch downs for each of the first probe pads or set of probe pads; and
   executing a second series of touch downs for each of the second probe pads or set of probe pads.

6. The method according to claim 1, comprising forming a single probe pad or set of probe pads and a single DUT or set of DUTs of the second group within the probe pitch.

7. The method according to claim 6, wherein a size and/or electrical requirement of each of the DUTs of the second group prevents two probe pads or sets of probe pads from being formed within the probe pitch.

8. The method according to claim 6, comprising forming the second group of probe pads and DUTs in a linear pattern.

9. The method according to claim 8, comprising forming the linear pattern with a DUT between each pair of the probe pads or sets of probe pads.

10. A device comprising:
    a first group of probe pads or sets of probe pads and devices under test (DUTs) in a pad row on a wafer; and
    a second group of probe pads and DUTs in the pad row on the wafer,
    wherein the probe pads or set of probe pads of the first group are staggered along the pad row, and each DUT of the first group is aligned with a probe pad perpendicular to the pad row, each DUT of the first group corresponding to a single probe pad of the first group, and each probe pad of the first group corresponding to a single DUT of the first group.

11. The device according to claim 10, wherein two probe pads or sets of probe pads and two DUTs or sets of DUTs of the first group are formed within a probe pitch.

12. The device according to claim 11, wherein a first DUT or set of DUTs of the first group is formed on a first side of a first probe pad or set of probe pads of the first group and a second DUT or set of DUTs of the first group is formed on a second side of a second probe pad or set of probe pads of the first group.

13. The device according to claim 10, wherein consecutive DUTs or sets of DUTs of the first group are formed on alternating sides of corresponding probe pads or set of probe pads.

14. The device according to claim 10, wherein a single probe pad or set of probe pads and a single DUT of the second group is formed within the probe pitch.

15. The device according to claim 14, wherein the second group of probe pads and DUTs are formed in a linear pattern with a DUT between each of the probe pads or sets of probe pads.

16. A method comprising:
    forming first, second, third, and fourth lines of probe pads parallel to each other on a wafer, wherein the probe pads of the second and fourth lines are staggered with respect to the probe pads of the first and third lines, respectively, and wherein each of the first, second, third, and fourth lines of probe pads comprise a plurality of probe pads;
    forming DUTs between the second and third lines,
    wherein a first probe pad of the first line, a first probe pad of the second line, a DUT, a first probe pad of the third line, and a first probe pad of the fourth line are within a probe pitch;

connecting first and second probe pads of the first line and first and second probe pads of the third line to a first DUT; and connecting first and second probe pads of the second line and first and second probe pads of the fourth line to a second DUT.

17. The method according to claim 16, comprising forming two additional lines of probe pads, separate from the first, second, third, and fourth lines of probe pads, and a row of DUTs between the two additional lines of probe pads, with one DUT between each set of two probe pads of a first of the two additional lines and two probe pads of a second of the two additional lines.

18. The method according to claim 17, wherein one probe pad from the first additional line, one probe pad from the second additional line, and a DUT are within a probe pitch, and wherein a size and/or an electrical requirement of each of the DUTs between the first and second additional two lines prevents an additional DUT or a line of probe pads from being formed within the probe pitch.

* * * * *